United States Patent
Hacke et al.

(10) Patent No.: US 6,930,383 B2
(45) Date of Patent: Aug. 16, 2005

(54) ELECTRONIC COMPONENT INCLUDING A HOUSING AND A SUBSTRATE

(75) Inventors: Hans-Jürgen Hacke, München (DE);
Holger Hübner, Baldham (DE); Axel Königer, München (DE);
Max-Gerhard Seitz, München (DE);
Rainer Tilgner, München (DE)

(73) Assignee: Infineon Technologies AG, Munich (DE)

( * ) Notice: Subject to any disclaimer, the term of this patent is extended or adjusted under 35 U.S.C. 154(b) by 133 days.

(21) Appl. No.: 10/320,946

(22) Filed: Dec. 16, 2002

(65) Prior Publication Data

US 2003/0116840 A1 Jun. 26, 2003

Related U.S. Application Data

(63) Continuation of application No. PCT/DE01/01989, filed on May 28, 2001.

(30) Foreign Application Priority Data

Jun. 14, 2000 (DE) .......................................... 100 29 269

(51) Int. Cl.$^7$ .............................................. H01L 21/00
(52) U.S. Cl. .................... 257/700; 257/703; 257/690
(58) Field of Search ................................ 257/700, 703, 257/690, 698, 347, 74

(56) References Cited

U.S. PATENT DOCUMENTS

| | | | | |
|---|---|---|---|---|
| 5,627,406 A | * | 5/1997 | Pace | 257/700 |
| 5,793,105 A | * | 8/1998 | Pace | 257/700 |
| 5,833,759 A | * | 11/1998 | Haslow et al. | 134/1.3 |
| 5,841,075 A | * | 11/1998 | Hanson | 174/250 |
| 5,866,441 A | * | 2/1999 | Pace | 438/108 |
| 5,889,462 A | * | 3/1999 | Rana et al. | 338/254 |
| 5,904,499 A | * | 5/1999 | Pace | 438/108 |
| 6,103,992 A | * | 8/2000 | Noddin | 219/121.71 |
| 6,130,015 A | * | 10/2000 | Noddin et al. | 430/22 |
| 6,165,820 A | * | 12/2000 | Pace | 438/125 |

FOREIGN PATENT DOCUMENTS

JP    10 032 224 A    2/1998

OTHER PUBLICATIONS

Brockhaus Conversations–Lexikon [Brockhaus Conversation Lexicon], Ed. 13, vol. 16, p. 665, 1887.
Winacker et al.: "Chemische Technologie" [Chemical Technology], Carl Hanser Verlag München, Ed. 4, vol. 3, 1983, pp. 435, 436, and 461.

* cited by examiner

Primary Examiner—Laura M Schillinger
(74) Attorney, Agent, or Firm—Laurence A. Greenberg; Werner H. Stemer; Ralph E. Locher

(57) ABSTRACT

The invention relates to an electronic component including a housing and a first substrate having at least one integrated circuit, a multiplicity of contact surfaces arranged in an arbitrary distribution on the surface of the first substrate. A second substrate forms a housing and is mechanically joined to the surface of the first substrate in a surface-to-surface contact, via an insulating joining layer. The second substrate has contact connection surfaces that are surface-to-surface connected to the contact surfaces of the first substrate in an electrically conductive manner. The second substrate has symmetrically arranged external contact surfaces that are conductively connected to the contact connection surfaces via through-contacts in the second substrate.

11 Claims, 2 Drawing Sheets

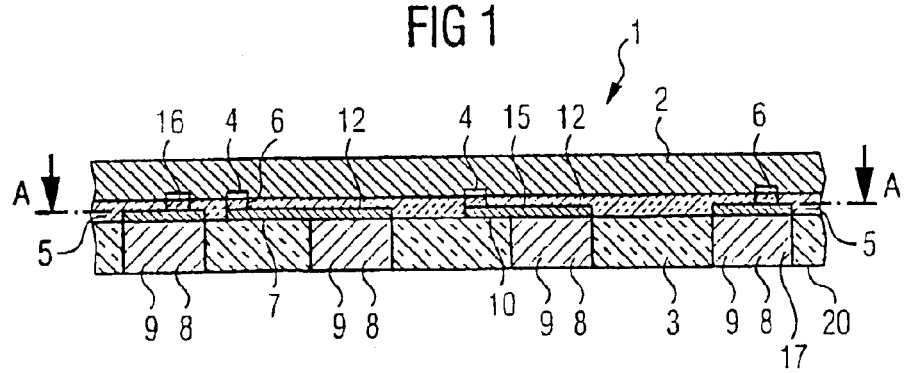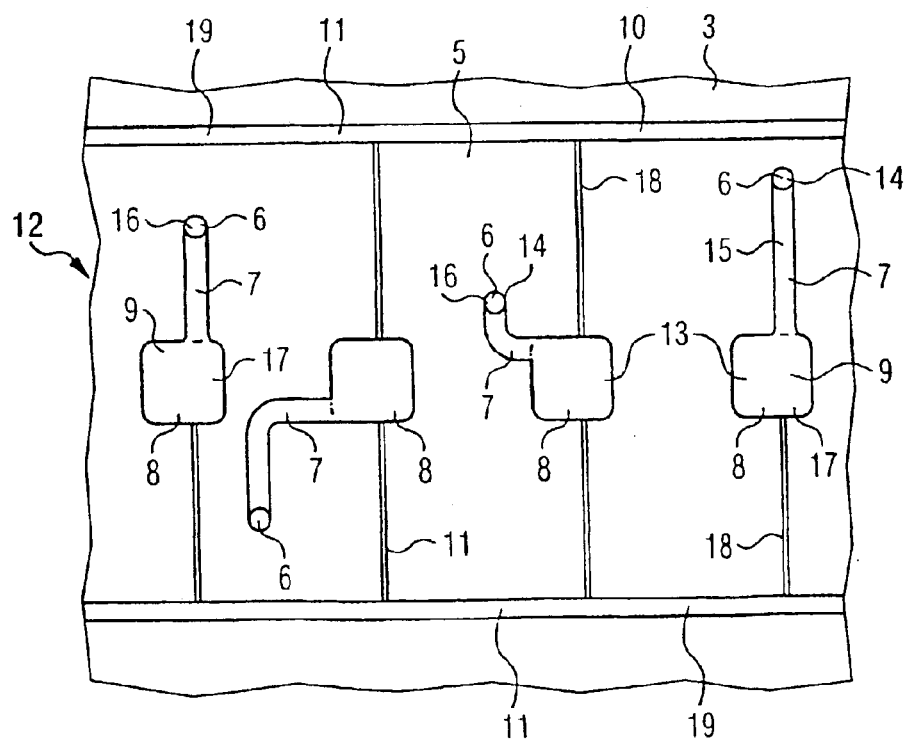

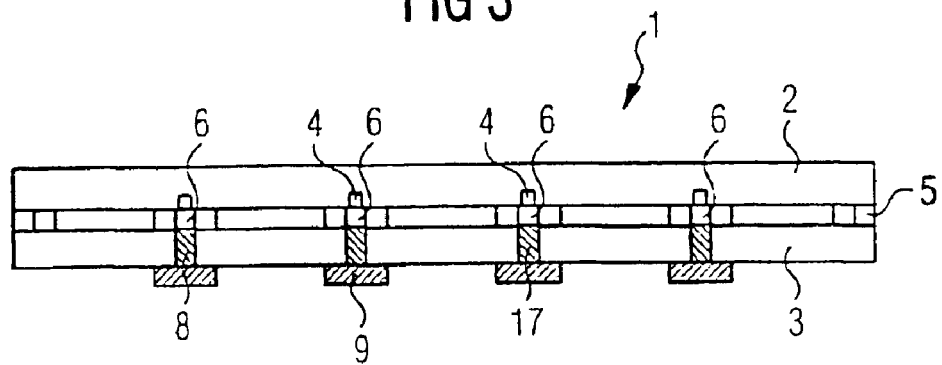
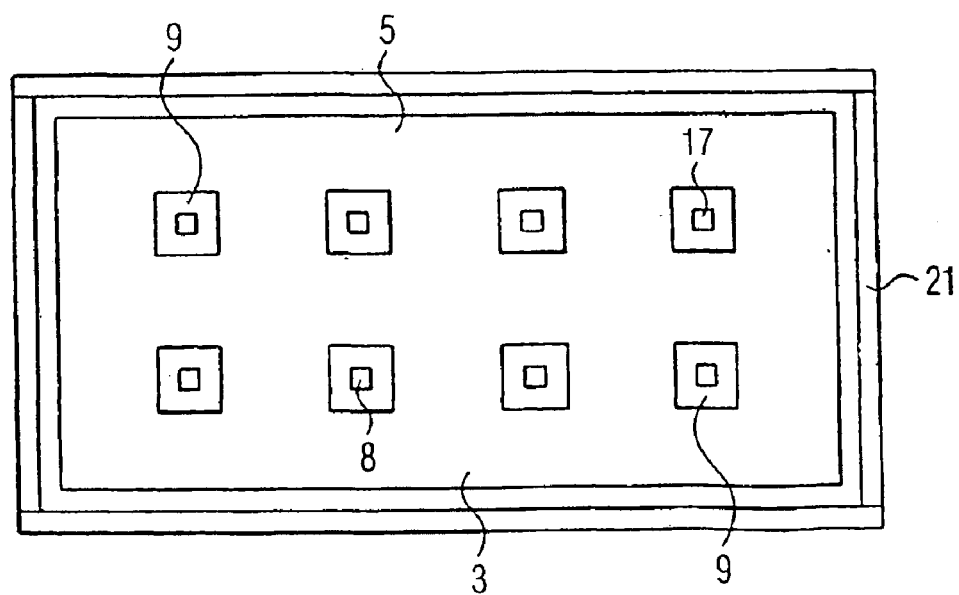

ELECTRONIC COMPONENT INCLUDING A HOUSING AND A SUBSTRATE

CROSS-REFERENCE TO RELATED APPLICATION

This application is a continuation of copending International Application No. PCT/DE01/01989, filed May 28, 2001, which designated the United States and was not published in English.

BACKGROUND OF THE INVENTION

Field of the Invention

The invention relates to an electronic component including a housing and a first substrate, which has at least one integrated circuit and a multiplicity of microscopically small contact surfaces, which are connected to electrodes of elements of the electronic component via interconnects.

Conventional packaging concepts for substrates work on the basis that the substrate is completely surrounded by a potting compound. Therefore, the housing has larger dimensions than the substrate. With this conventional packaging concept, it is only possible to package individual semiconductor chips as substrates. Wafer level packaging, which would greatly accelerate the process and could also allow costs to be reduced, has not hitherto been achieved. In addition, with the previous joining techniques, the low thermal stability of soldered joints in a housing concept such as the BGA (ball grid array) concept provides serious reliability problems. Hitherto, there has been no high-performance, successful concept for wafer level packaging which has become accepted on a global footing.

SUMMARY OF THE INVENTION

It is accordingly an object of the invention to provide an electronic component and a method for fabricating the electronic component which overcome the above-mentioned disadvantages of the prior art apparatus and methods of this general type.

In particular, it is an object of the invention to provide an electronic component including a housing and a substrate in which the housing dimensions match the dimensions of the substrate.

With the foregoing and other objects in view there is provided, in accordance with the invention, an electronic component including: a first substrate having a surface, at least one integrated circuit, and a plurality of microscopically small contact surfaces configured in an arbitrary distribution on the surface of the first substrate; an insulating joining layer; and a second substrate forming a housing, the second substrate having a plurality of symmetrically configured external contact surfaces, a plurality of interconnects, and a plurality of through-contacts formed therein. The second substrate includes rewiring insulated from the plurality of the interconnects on the second substrate. The insulating joining layer mechanically joins the second substrate to the surface of the first substrate and forms a surface-to-surface, hermetically sealed contact. The second substrate has a plurality of contact connection surfaces that are surface-to-surface contact connected to the plurality of the contact surfaces of the first substrate in an electrically conductive manner. The plurality of the contact connection surfaces of the second substrate are connected via the rewiring and via the plurality of the through-contacts in the second substrate to the plurality of the symmetrically configured external contact surfaces of the second substrate.

With the foregoing and other objects in view there is provided, in accordance with the invention, a method for fabricating an electronic component. The method includes steps of: providing a first substrate having microscopically small contact surfaces connected to electrodes of elements of the electrical component via interconnects on the first substrate; applying a continuous conductive layer to a second substrate; obtaining a structured conductive layer by structuring the continuous conductive layer to form: a rewiring pattern having large-area regions for connecting to external contact surfaces, connecting tracks being disconnectable from the rewiring, and microscopically small regions for contact connection surfaces being sized and configured in a manner corresponding to said contact surfaces of the first substrate; coating the structured conductive layer with an insulating joining layer; producing passage openings through the insulating joining layer to the microscopically small regions of the structured conductive layer forming the rewiring; producing passage openings through the second substrate in regions of the external contact surfaces; filling the passage openings in the insulating joining layer and the passage openings in the second substrate with a conductive material; coating the contact connection surfaces and/or the contact surfaces with a metal alloy coating; activating a surface of the insulating joining layer; pressing the second substrate with the joining layer onto the first substrate, and simultaneously partially melting the metal alloy coating at a conditioning temperature; and maintaining the conditioning temperature until isothermally solidifying a connection between the contact surfaces and the contact connection surfaces.

The inventive solution provides a first substrate, on the surface of which a multiplicity of contact surfaces is arranged in an arbitrary distribution. A second substrate, which forms the housing, is mechanically joined with a surface-to-surface, hermetically sealed contact, via an insulating joining layer, to the surface of the first substrate. The second substrate has contact connection surfaces that are surface-to-surface contact connected to the multiplicity of contact surfaces of the first substrate in an electrically conductive manner. The contact connection surfaces are connected, via a rewiring which is insulated from the interconnects on the second substrate and via through-contacts in the second substrate, to symmetrically arranged external contact surfaces of the second substrate which forms the housing.

This packaging concept including two substrates, namely the first substrate, which has at least one integrated circuit, and a joining layer, which mechanically and electrically joins the first substrate to the second substrate. The second substrate has external contact surfaces which are significantly larger and therefore more readily accessible than the microscopically small contact surfaces of the first substrate. This provides the advantage that the second substrate can be produced with the same dimensions as a semiconductor wafer having a multiplicity of integrated circuits. Accordingly, the second substrate likewise has a multiplicity of rewirings which are accommodated within the joining layer. The joining layer therefore includes two levels, namely the rewiring level and an insulating level which is located above the rewiring level and at the same time produces the mechanical joining to the first substrate.

A particular advantage is that with this solution no particular demands are imposed on the distribution of the microscopically small contact surfaces on the first substrate, but rather these contacts can be distributed completely arbitrarily on the first substrate, as required and as desired.

The rewiring, which is supported by the second substrate, advantageously converts the arbitrarily arranged microscopically small contact surfaces into symmetrically arranged external contact surfaces. These external contact surfaces can be directly connected to large-area contacts, such as those which are required for chip cards, or can be operatively connected to corresponding printed circuit boards and flexible conductors. With the symmetrical arrangement of the external contacts of this housing, the size of which corresponds to the first substrate, it is possible for the external contacts to be arranged in rows and/or columns or for the edges of the substrate to be occupied or for occupancy to be limited to a central line. Therefore, this arrangement can depend entirely on the requirements of a higher-order circuit.

In a preferred embodiment of the invention, the first substrate is a semiconductor wafer. This has the advantage that a multiplicity of electronic components can simultaneously be provided with a second housing substrate, and therefore the packaging is automatically completed when the wafer is divided into individual electronic components.

In a further preferred embodiment of the invention, the second substrate is a film strip. This has the advantage that a multiplicity of wafers can be successively applied to the film strip with repeating structures for wiring contact connection surfaces to external contacts, so that all of the processing steps through to dividing into individual electronic components can initially be carried out synchronously for all the wafers together. In this case, the film strip is advantageously larger than the external dimensions of a wafer, which may preferably be provided with a perforation in the edge region, in order to ensure that the fabrication steps proceed automatically.

In a further preferred embodiment, the first substrate is a semiconductor chip and the second substrate is an endless strip with a structured copper-laminated layer. In this embodiment, the wafer is divided prior to packaging, but only one substrate region is cut out of the endless strip after the completion of the mechanical and electrical joining and the connection between the two substrates. This substrate region corresponds to the size of the semiconductor chip. In this case too, cost savings are to be expected, since a film strip of this type having a structured metal layer can be mechanically and electrically joined and connected to the semiconductor chips relatively reliably and easily.

The second substrate is preferably produced from a polyamide; this polyamide has the advantage that both endless strips and second substrates can be produced in approximately the same size as a wafer.

In a further preferred embodiment of the invention, the rewirings on the second substrate are temporarily short-circuited via common electrically conductive, disconnectable connecting tracks. These connecting tracks have the advantage that during the production of the second substrate there is joint electrical access to the rewirings, and on the other hand, during the separating operation, the short-circuiting connecting tracks can be severed.

The interconnects of the first substrate are preferably insulated from the rewiring of the second substrate by a polyamide layer serving as the joining layer. This polyamide layer is extremely small compared to the thickness of the second substrate and is used only for insulation between interconnects and rewiring and as an adhesive mechanical joint between the first substrate and the second substrate.

The rewiring preferably has a structured copper alloy layer with electrodeposited through-contacts to the external contact surfaces and with electrodeposited contact connection surfaces. The electrodeposited contact connection surfaces are at least the same thickness as the insulating joining layer, and the through-contacts to the external contact surfaces are at least of a thickness which corresponds to the thickness of the second substrate. With this rewiring concept of the second substrate, it is possible for the contact connection surfaces to be brought into direct contact with the contact surfaces of the first substrate. To ensure an electrical connection and a mechanically reliable joint between the contact connection surfaces and the contact surfaces, at least one of the two types of contact surfaces is coated with an indium-tin compound, which as the eutectic compound has a relatively low melting point and therefore the contact connection surfaces can preferably be joined to the contact surfaces by means of diffusion soldering. Therefore, a first substrate, which represents a substrate with elements which can be flexibly configured, and a second substrate, which fulfills the function of rewiring and making contact, are advantageously joined to one another using a joining technique which simultaneously satisfies the functions of electrical contact-making, mechanical joining of the two substrates, and also hermetic sealing. The advantages of this arrangement are the implementation of packaging with minimal dimensions and the possibility of wafer level processing.

Joining the contact connection surfaces and the contact surfaces by diffusion soldering has the further advantage in a huge increase in the reliability of the electronic component, on account of the high melting point of the joint created. On account of the formation of intermetallic phases during isothermal solidification, this high melting point of the joint created is well above the actual melting point of the coating applied to the contact surfaces and/or the contact connection surfaces. This joining via isothermal solidification has significant advantages in particular over the relatively moderate temperatures in the prior art, which are approximately 200° C.

The use of a joining layer for simultaneously fulfilling the functions of making electrical contact, mechanical joining, and hermetic sealing defines a novel semiconductor element of minimal dimensions.

An inexpensive adapter function can be realized by the rewiring which is supported by the second substrate, making it possible to fabricate chips with only one design variant and to match them to specific customer requirements by using a rewiring level that will subsequently be applied with the second substrate. This advantageously results in additional degrees of freedom in chip design; for example, the contact surfaces can become smaller and can be positioned freely as required within the chip area and beyond active structures. The production of the first substrates with the integrated circuits likewise becomes less expensive, since only one embodiment is required for numerous possible circuit variants. Furthermore, the number of contact surfaces can increase, while the chip area per se is reduced in size.

The rewiring level can preferably be produced using inexpensive methods and is not directly part of the relatively expensive chip production, but rather is part of a build-up technology used in a novel housing technology. A decision as to whether the wiring level and therefore the second substrate are produced with the same order of magnitude as semiconductor wafers or with the same order of magnitude as individual chips may depend entirely on the cost-benefit analysis. The preferred rewiring on a second substrate makes it possible to use various build-up processes. The microscopically small contact connection surfaces, which are positioned freely and arbitrarily, can lead to large external contact surfaces arranged at the edge of the rewiring level. From there, the chip that is packaged by the second substrate can then be packaged, preferably using wire bonding methods, in any desired larger housing units, with the result that the critical step of wire bonding on the chip surface itself is avoided. However, the rewiring level can also lead directly to large external contact connection surfaces within the chip area, by means of which the chip packaged by the second substrate can be mounted on printed circuit boards as a flip-chip.

A preferred method for fabricating an electronic component includes the following method steps:

a) providing a first substrate having microscopically small contact surfaces, which are connected to electrodes of elements of the electrical component via interconnects on the first substrate;

b) applying a continuous conductive layer to a second substrate;

c) structuring the conductive layer to form a rewiring pattern, which has large-area regions for connecting to external contact surfaces and microscopically small regions for producing contact connection surfaces of the order of magnitude and arrangement of the contact surfaces with respect to the rewiring and disconnectable connecting tracks;

d) coating the structured conductive layer with an insulating joining layer;

e) producing passage openings through the insulating joining layer to microscopically small regions of the structured conductive layer for the rewiring;

f) producing passage openings through the second substrate in regions of the external contact surfaces;

g) filling the passage openings with conductive material;

h) coating the contact connection surfaces with a metal alloy coating;

i) activating the surface of the insulating joining layer;

j) pressing the second substrate with the joining layer onto the first substrate, with a simultaneous partial melting of the metal alloy coating at a conditioning temperature; and k) maintaining the conditioning temperature until achieving isothermal solidification of the connection between contact surfaces and contact connection surfaces.

With these method steps it is advantageously possible for a first substrate to be packaged using a second substrate, the dimensions of the electronic component being no greater than the dimensions of the first substrate. If this method is used for a wafer having a plurality of electronic components, the first substrate is the wafer and the second substrate is at least as large as the wafer and its rewiring is accurately matched to the electronic components that are embodied on the surface of the semiconductor wafer.

Therefore, after a connection has been produced between the contact surfaces and the contact connection surfaces, it is preferable for a plurality of electronic components on a semiconductor wafer to be separated to form individual electronic components by cutting through the connecting tracks. These connecting tracks are first required in fabrication step g), in order to fill the passage openings leading both to the microscopically small contact connection surfaces and to the larger external contact surfaces of the second substrate with conductive material.

The continuous conductive layer on the second substrate can preferably be deposited on the second substrate by performing evaporation coating, sputtering or deposition. In a preferred method, a copper alloy layer is applied as the continuous conductive layer. This has the advantage that it can be electrodeposited at relatively low cost. After structuring the conductive layer and after the passage openings through an insulating joining layer that has been applied to the structured conductive copper layer have been opened up, and after the through-contacts through the second substrate have been opened up, the passage openings can be filled with metal inexpensively by the electrodeposition of a copper alloy.

In a further preferred embodiment of the method, a polyamide film which is laminated to a copper alloy can be used as the second substrate. The structuring of the copper alloy layer on the polyamide film can be effected by using photolithography methods, as a result of applying a photosensitive thin insulating layer to the copper alloy layer and using mask technology to expose only the regions that will not be removed during the subsequent development and etching step.

After removal of the etching wash for the structuring, an insulating joining layer can preferably be applied to the structured conductive layer by spin-on, spray-on or dipping.

It is preferable for a photosensitive dielectric to be applied to the structured conductive layer as the insulating joining layer, so that once again passage openings through the insulating joining layer can be produced by using a photolithography method in order to uncover the contact connection surface regions.

The production of passage openings both in the thin insulating joining layer and in the thick second substrate may be achieved by using a laser ablation, ion beam sputtering or plasma etching. These processes have the advantage of producing very sharply defined and vertical walls for the passage openings.

The passage openings are preferably filled with conductive material by electrodeposition. For this purpose, a cathode potential is applied to the structured metal layer via the connecting tracks which short-circuit all the rewirings, so that the metal of the anode is deposited on and in the passage openings. Electrodeposition has the advantage that metal can only be deposited where the anode potential is available, so that conductive material is selectively deposited through the passage openings.

In a further preferred embodiment of the method, the passage openings are filled by performing electroless deposition, in which case, however, there is a risk of metal being deposited on the entire surface of the second substrate. The same risk exists if the passage openings are filled by performing chemical vapor deposition.

In a further embodiment of the method, the contact surfaces of the first substrate are produced from an aluminum alloy, and the contact connection surfaces of the second substrate are coated with a gold alloy. When these components are pressed together and heated, intermetallic phases, which can be subjected to higher thermal loads than the conditioning temperature required to form these intermetallic phases, are formed.

In a further preferred embodiment of the method, the contact connection surfaces are coated with a nickel layer and a gold layer, in order to prevent the material of the contact connection surfaces from diffusing through a gold coating to the interface of the join between gold and aluminum.

In a further preferred embodiment of the method, the contact connection surfaces and/or the contact surfaces are coated with an indium-tin alloy. The indium-tin eutectic melts at a temperature of around 120° C., and the formation of intermetallic phases with the copper of the contact connection surfaces results in a connection that allows thermal loads of well over 600° C.

The coating of the contact surfaces and/or the contact connection surfaces with metal alloys of this type may take place by electroplating or electroless plating or by evaporation coating or sputtering on a metal alloy. Vapor deposition of a metal alloy is also provided for in a preferred embodiment of the method.

To improve the external contact surfaces, the external contact surfaces may be coated with an oxidation-inhibiting conductive layer, preferably including a gold alloy. For this purpose, the oxidation-inhibiting conductive layer can be applied by screen printing or stencil printing methods. If the external contact surfaces will be prepared for joining by soldering to a higher-order circuit, they are preferably coated with a solderable metal alloy, which can preferably be carried out by using a soldering wave bath process.

Other features which are considered as characteristic for the invention are set forth in the appended claims.

Although the invention is illustrated and described herein as embodied in an electronic component including a housing and a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a partial cross-sectional view through an embodiment of the invention;

FIG. 2 is a plan view of a wiring level on an embodiment of the invention;

FIG. 3 is a view showing a basic structure of an embodiment of the invention; and FIG. 4 is a plan view of the surface with contact connection surfaces of an embodiment of the invention.

DESCRIPTION OF THE PREFERRED EMBODIMENTS

Referring now to the figures of the drawing in detail and first, particularly, to FIG. 1 thereof, there is shown a partial cross-sectional view through an embodiment of the invention. In this embodiment, the starting material is a copper-laminated film on a second substrate 3 including a 50 $\mu$m thick polyimide layer. The continuous conductive layer 12 of copper is first structured by performing photolithography and wet etching. A structure of this type can be seen in the plan view shown in FIG. 2. The wiring level of this embodiment shown in FIG. 2 has already been structured, so that lateral tracks of the rewiring 7 and microscopically small contact connection surfaces 6 and external contact connection surfaces 9, which are large compared to the contact connection surfaces 6, can be seen. In this embodiment, the microscopically small contact connection surfaces 6 have a diameter of 20 $\mu$m, and the external contact surfaces cover an area of 100×100 $\mu$m². The individual tracks of the rewiring initially remain connected to the edge 19 via small webs 18, so that, during the subsequent electrodeposition for filling passage openings 17 through the second substrate 3 and for filling passage openings 16 through the insulating joining layer 5 with conductive material, contacts can be made with them. After the structuring, an adhesive layer, for example of polyimide, which can be patterned by photographic techniques, is applied to the copper side of the copper-laminated film, and the small chip-side passage openings for the contact connection surfaces are prepared. It is optionally also possible to realize a second wiring level first.

In this embodiment of the invention, the second substrate 3 is opened up on the underside at the locations of the large-area external contacts by performing laser ablation. The small and large passage openings 16, 17 can then be filled on both sides by electrodepositing copper or solder metal. After the passage openings 16, 17 have been filled with conductive material, the insulating joining layer 5 including polyimide is made adhesively active by performing a plasma treatment. Then, the second substrate 3 including the polyimide film is adhesively bonded either to an entire semiconductor wafer or to an individual semiconductor chip and is joined to the contact surfaces of the semiconductor chip or of the semiconductor wafer. The diffusion soldering process is used to do this, as a result of applying a 2 $\mu$m thick tin-indium eutectic to the contact connection surfaces 6 prior to the diffusion soldering, so that it is possible to connect the contact connection surfaces 6 to the contact surfaces 4 via isothermal solidification at 120° C. In this method, intermetallic compounds are formed, so that this electrical connection has a melting point of over 600° C. and is no longer opened up during subsequent soldering of the electronic component onto a printed circuit board. During the further processing, the thin connecting tracks 11 can be interrupted by cutting off the edge 19, so that the rewiring 7 of the second substrate 3 becomes fully functional.

FIG. 3 shows a basic structure of an embodiment of the invention which substantially includes two substrates, namely the first substrate 2, which bears an integrated circuit, and a second substrate 3, which has a rewiring in the insulating joining layer 5. On the outer side of the substrate 3, the metallic through-contacts 8 have external contact surfaces 9, which are electrically connected to microscopically small contact connection surfaces 6 via the through-contacts 8. The contact connection surfaces 6 are electrically connected to microscopically small contact surfaces 4 of the first substrate 2. The outer edge 21 of an individual electronic component, as can be seen in plan view in FIG. 4, may consist of a hermetically sealing silicone compound, but this is only necessary if particularly high demands are imposed on the electronic component. FIG. 4 diagrammatically depicts a plan view of the area with external contact surfaces 9 of an embodiment of the invention. The external contact surfaces are larger than the through-contacts 8 that lead to the rewiring within the electronic component.

As is clearly shown by the abovementioned FIG. 2, the contact connection surfaces 6 can be arranged in an arbitrary distribution on the first substrate and can be made into symmetrically arranged external contact surfaces 9 via the wiring 7, as can be seen from FIG. 2 and FIG. 4. There may be any desired number of external contact surfaces; this number has only been limited to four in FIG. 2 and to eight external contact surfaces 9 in FIG. 4 for the purpose of simplicity and explanation. The embodiments shown in FIGS. 1 and 2 differ from the embodiments shown in FIGS. 3 and 4 in that the external contact surfaces 9 in FIGS. 1 and 2 match the size of the passage openings in the second substrate 3 and in FIGS. 3 and 4 the passage openings 17 in the second substrate 3 are significantly smaller than the external contact surfaces 9.

We claim:

1. An electronic component, comprising;
    a first substrate having a surface at least one integrated circuit, and a plurality of microscopically small contact surfaces configured in an arbitrary distribution on said surface of said first substrate;
    an insulating joining layer; and
    a second substrate forming a housing, said second substrate having a plurality of symmetrically configured external contact surfaces, a plurality of interconnects, and a plurality of through-contacts formed therein;
    said second substrate including a rewiring insulated from said plurality of said interconnects on said second substrate;
    said insulating joining layer mechanically joining said second substrate to said surface of said first substrate and forming a surface-to-surf ace, hermetically sealed contact;
    said second substrate having a plurality of contact connection surfaces being surface-to-surface contact connected to said plurality of said contact surfaces of said first substrate in an electrically conductive manner; and
    said plurality of said contact connection surfaces of said second substrate being connected via said rewiring and via said plurality of said through-contacts in said second substrate to said plurality of said symmetrically configured external contact surfaces of said second substrate.

2. The electronic component according to claim 1, wherein said first substrate is a semiconductor wafer.

3. The electronic component according to claim 1, wherein said second substrate is a film strip.

4. The electronic component according to claim 1, wherein said first substrate is a semiconductor chip and said second substrate is a strip having a structured copper-laminated layer.

5. The electronic component according to claim 1, wherein said second substrate is produced from a polyamide.

6. The electronic component according to claim 1, comprising:
    a plurality of rewirings configured on said second substrate and insulated from said plurality of said interconnects on said second substrate; and
    a plurality of common electrically conductive, disconnectable connecting tracks short circuiting said plurality of said rewirings on said second substrate.

7. The electronic component according to claim 1, wherein:
    said first substrate has a plurality of interconnects that are insulated from said rewiring by said insulating joining layer; and
    said insulating joining layer is a polyamide layer.

8. The electronic component according to claim 1, wherein:
    said rewiring has a structured copper alloy layer formed with said plurality of said through-contacts arid with said contact connection surfaces; and
    said plurality of said through-contacts and said contact connection surfaces are electrodeposited.

9. The electronic component according to claim 1, wherein said plurality of said contact connection surfaces of said second substrate are coated with an indium-tin compound.

10. The electronic component according to claim 1, wherein said plurality of said contact connection surfaces of said second substrate and said plurality of said contact surfaces of said first substrate are joined by diffusion soldering.

11. The electronic component according to claim 1, wherein said insulating joining layer is adhesively active.

* * * * *

UNITED STATES PATENT AND TRADEMARK OFFICE
CERTIFICATE OF CORRECTION

PATENT NO. : 6,930,383 B2
DATED : August 16, 2005
INVENTOR(S) : Hans-Juergen Hacke et al.

It is certified that error appears in the above-identified patent and that said Letters Patent is hereby corrected as shown below:

Column 9,
Line 21, should read as follows:
-- and forming a surface-to-surface, hermetically sealed --.

Column 10,
Line 24, should read as follows:
-- with said plurality of said through-contacts and with --.

Signed and Sealed this

Eleventh Day of October, 2005

JON W. DUDAS
*Director of the United States Patent and Trademark Office*